(12) United States Patent
Schneider et al.

(10) Patent No.: US 6,947,414 B1
(45) Date of Patent: Sep. 20, 2005

(54) DEVICE FOR EMITTING THE RESPONSE OF A SYNCHRONOUS SYSTEM TO AN ASYNCHRONOUS EVENT

(75) Inventors: Peter Schneider, Munich (DE); Thomas Steinecke, Hofsingelding (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/623,296

(22) PCT Filed: Feb. 19, 1999

(86) PCT No.: PCT/DE99/00462

§ 371 (c)(1),
(2), (4) Date: Sep. 1, 2000

(87) PCT Pub. No.: WO99/45647

PCT Pub. Date: Sep. 10, 1999

(30) Foreign Application Priority Data

Mar. 5, 1998 (DE) ................................. 198 09 439

(51) Int. Cl.$^7$ ........................ H03K 5/135; H03K 17/30
(52) U.S. Cl. ..................... 370/360; 370/516; 375/370; 713/502; 713/503
(58) Field of Search ............................ 370/357, 360, 370/503, 516, 517, 537, 538; 375/357, 369, 375/370, 371; 327/2, 3, 39, 40, 41, 63, 68, 327/365; 713/400, 500, 502, 503

(56) References Cited

U.S. PATENT DOCUMENTS

| | | | | |
|---|---|---|---|---|
| 4,544,851 A | * | 10/1985 | Conrad et al. | ............... 327/144 |
| 5,034,967 A | * | 7/1991 | Cox et al. | ................... 375/373 |
| 5,148,533 A | | 9/1992 | Joyce et al. | |
| 5,168,564 A | * | 12/1992 | Barlow et al. | ................ 714/19 |
| 5,331,669 A | * | 7/1994 | Wang et al. | ................ 375/371 |
| 5,418,825 A | * | 5/1995 | Cantrell et al. | ............... 377/48 |
| 5,519,700 A | | 5/1996 | Punj | |
| 5,621,892 A | * | 4/1997 | Cook | .......................... 709/224 |
| 5,903,777 A | * | 5/1999 | Brief | ............................ 710/60 |

FOREIGN PATENT DOCUMENTS

| | | |
|---|---|---|
| DE | 36 89 968 | 6/1987 |
| DE | 40 37 062 | 5/1996 |
| DE | 196 04 602 | 6/1997 |
| EP | 0 279 564 | 8/1988 |
| EP | 0 652 658 | 5/1995 |

* cited by examiner

*Primary Examiner*—Alpus H. Hsu
(74) *Attorney, Agent, or Firm*—Schiff Hardin LLP

(57) ABSTRACT

An apparatus for immediately outputting a response of a synchronous system to an asynchronous event includes an advanced calculation device by means of which the responses of the synchronous system to possible asynchronous events can be calculated in advance. Also, a switching device is included by means of which the output signal from the advanced calculation device or the output signal from the synchronous system can be passed on selectively. It is thus possible to output responses from synchronous systems to asynchronous events immediately after such events occur.

7 Claims, 1 Drawing Sheet

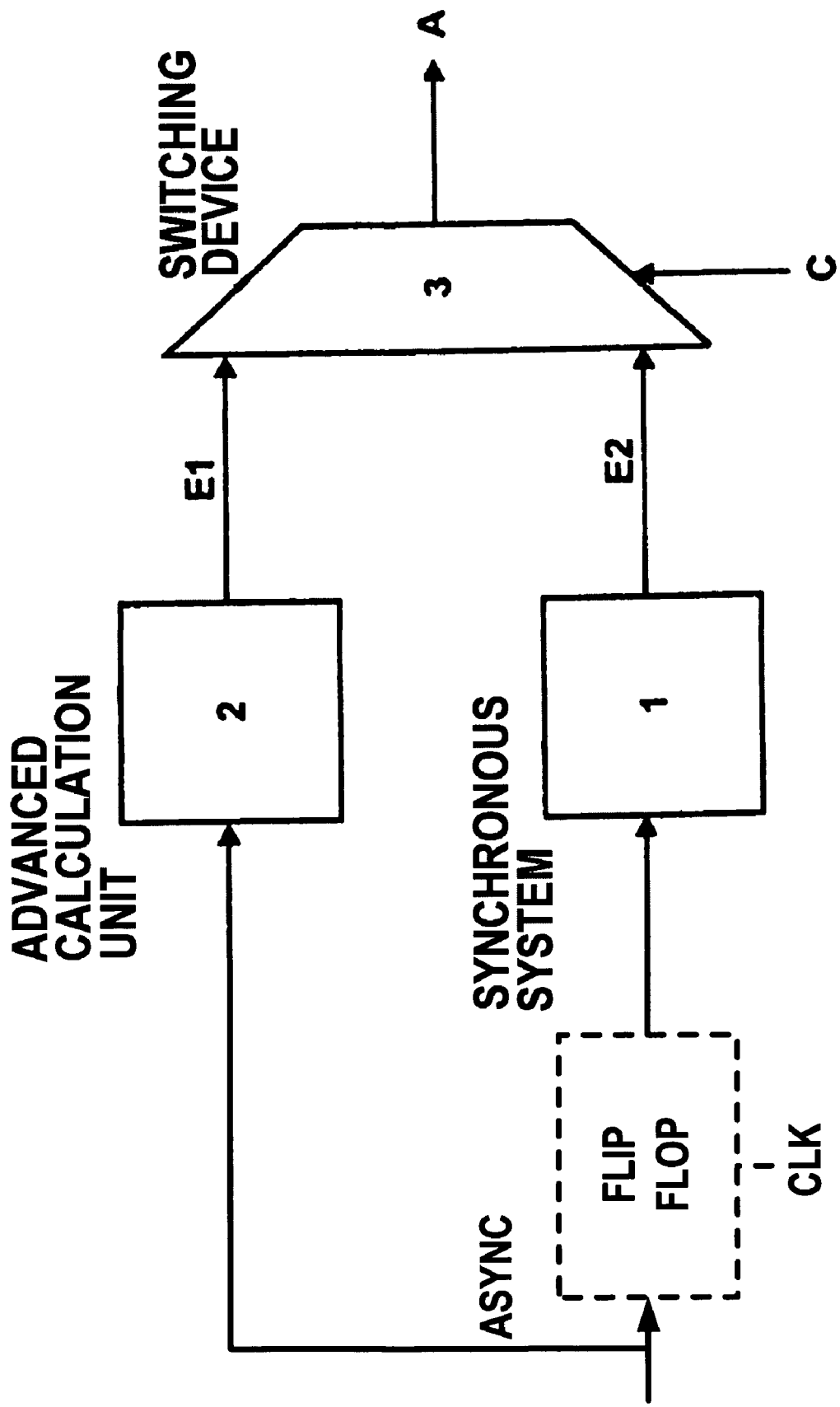

DEVICE FOR EMITTING THE RESPONSE OF A SYNCHRONOUS SYSTEM TO AN ASYNCHRONOUS EVENT

BACKGROUND OF THE INVENTION

The present invention relates to an apparatus for immediately outputting the response of a synchronous system to an asynchronous event.

A synchronous system is a system whose state changes only at specific (normally equidistant) times. Such a system is, for example, a digital circuit in which the sequential elements (the flipflops) and thus, the circuit containing the sequential elements as well, itself changes its state only during the rising or falling edge of a clock signal, or shortly after it (delayed by the gate delay times). The times at which state changes can occur are referred to in the following text as defined state changing times.

In contrast to this, an asynchronous event is an event that may occur at any time.

Since synchronous systems react on certain occasions with a defined result to events that occur more or less precisely at the defined state changing times, it has been found to be advantageous for the asynchronous events (or more precisely, the signals or signal changes which signal such events) to be synchronized (phased-in). This can be done, for example, by connecting a flipflop downstream from an input connection via which the asynchronous event is fed into the system, with the input of the flipflop and the asynchronous input connection of the synchronous system being connected to one another. Since signals applied to the flipflop input are transferred to the flipflop output only on the rising or falling edge of a clock signal, a synchronous (phase-in) signal is available at the flipflop output.

This makes it possible to ensure that the synchronous system always reacts correctly to asynchronous events.

Generally, however, the synchronous system does not respond immediately to an asynchronous event, but with a greater or lesser delay, since synchronous systems can in fact change their state only at the defined state changing times.

However, in certain cases, it is necessary to react to the occurrence of an asynchronous event immediately.

In order to achieve immediate reaction to asynchronous event in a synchronous system, it is possible for those parts of the system to which asynchronous events are input and which most produce a response to these events to be operated asynchronously. The relevant system parts can be operated asynchronously, for example, by simultaneously using the asynchronous event as the clock signal for these system parts, as a result of which the elements in the relevant system parts switch at the same time that asynchronous events occur. In this manner, it is possible to respond to asynchronous events immediately. However, a problem in this case is that the synchronously operating part of and the asynchronous part of it change their states at different times and must be synchronized with one another in a complex manner.

SUMMARY OF THE INVENTION

The present invention is thus based on an object of developing an apparatus that reacts immediately to asynchronous events in a simple manner.

This and other objects are achieved according to an aspect of the present invention utilizing an advanced calculation device that calculates the responses of the synchronous system to possible asynchronous events in advance, and a switching device that selectively passes on the output signal from the advanced calculation device or the output signal from the synchronous system.

As a result, it is possible to continue operating the synchronous system "normally" and essentially without any change. The fact that the system's response to asynchronous events takes place only after a greater or lesser delay after the occurrence of the asynchronous events is not disadvantageous since the capability to output a response calculated in advance by the advanced calculation device in the meantime affords the synchronous system the ability to react immediately and independently to asynchronous events. The currently determined response of the synchronous system need be only sufficiently early for the advanced calculation device to have sufficient time to calculate the response to the next asynchronous event in advance of the event occurrence.

Additional advantages and novel features of the invention will be set forth, in part, in the description that follows, and in part, will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

The single FIGURE shows, schematically, an apparatus according to an embodiment of the present invention for immediately outputting the response of a synchronous system to an asynchronous event.

DETAILED DESCRIPTION OF THE PREFERRED EMBODIMENTS

The apparatus described in more detail in the following description contains a "normal" synchronous system, that is to say a system that reacts synchronously to asynchronous events.

The asynchronous events or the signals which signal them are preferably synchronized or phased-in before being used by the synchronous system. To this end, the relevant event is delayed sufficiently such that it appears to the synchronous system as if the event had occurred at a defined state changing time. In the present case, this is achieved by connecting a flipflop downstream from the input connection via which the asynchronous event is input into the system, with the input of this flipflop and the asynchronous input connection of the synchronous system being connected to one another. Since signals that are applied to the flipflop input are transferred to the flipflop output only with the rising or falling edge of a clock signal, a synchronous (phased-in) signal is available at the flipflop output. As a rule, it has been found to be advantageous for at least one further flipflop to be connected downstream from the flipflop. This allows the occurrence of metastable states to be prevented.

In cases in which the synchronous system reacts correctly to the asynchronous events even without the events being synchronized, it is, possible to dispense with the synchronization of the asynchronous events.

In order to allow the system to react immediately to asynchronous events, the system also has an advanced calculation device and a switching device. The advanced calculation device is designed to calculate the responses of the synchronous system to possible asynchronous events in advance and the switching device is designed to optionally and selectively pass on either the output signal from the advanced calculation device or the output signal from the synchronous system.

The fundamental configuration of such an arrangement is shown in the FIGURE, with a synchronous system 1, the advanced calculation unit 2, and the switching device 3.

The switching device 3 may be, for example, a multiplexer and, in the example under consideration, has input connections E1 and E2, an output connection A and a control connection C, with the first input connection E1 being connected to the output connection of the advanced calculation unit 2, and with the second input connection E2 being connected to the output connection of the synchronous system 1. The signal which is output at the output connection A of the switching device 3 is either the signal applied to its input connection E1 or the signal applied to its other input connection E2. A control signal applied to the control connection C determines which of the input signals E1, E2 is passed on. The output signal A from the switching device 3 is, at the same time, the output signal from the entire apparatus. If the signal (not shown in the FIGURE) which is input into the apparatus is a signal signaling an asynchronous event, the output signal A from the switching device 3 represents the response of the synchronous system 1 to the asynchronous event.

The synchronous system 1 is the synchronous system which has already been described above.

As has already been stated above, the advanced calculation unit 2 is designed to determine the response to an event in advance (i.e., before the event occurs). If more than one event can occur, the responses may be determined for all the events or a selected number of events and can, at the same time, be applied to a plurality of input connections of the switching device 3 or, alternatively, can be applied to the switching device 3 via one or a relatively small number of input connections to the switching device.

When an asynchronous event occurs, it is now possible for the response, calculated in advance by the advanced calculation unit 2, to be output immediately. The response (which is preferably permanently applied via a flipflop or the like) that is produced at this stage at one of the input connections of the switching device 3 merely has to be passed on by the switching device 3 to its output connection A, which can be done without any problem, at any time and with immediate effect, via its control connection C.

In the given circumstances, there is no reason for the synchronous system 1 to react asynchronously to the asynchronous event. Finally, the response to the asynchronous event is output precisely at the time that it occurs. Nevertheless, the synchronous system also reacts to the asynchronous event and, in doing so, comes to the same conclusion as the advanced calculation carried out by the advanced calculation unit 2.

As soon as the response of the synchronous system 1 occurs, the response is applied to the input connection E2 of the switching device 3 and causes, via the control connection C, the switching device 3 to pass this signal straight on to the input connection A.

Since the response of the synchronous system 1 to the asynchronous event and the response determined in advance by the advanced calculation unit 2 are the same (they just originate from different sources), nothing changes at the output connection A of the switching device 3. However, in this way, the advanced calculation device can start to calculate the response to the next asynchronous event or the responses to the various next asynchronous events, in advance.

Although it is unnecessary for the synchronous system 1 to react immediately to the asynchronous event, it must not take an indefinite time to do so. The process of finding the response must be completed sufficiently early so that the advanced calculation device still has sufficient time to calculate the response to the next asynchronous event or the responses to various asynchronous events in advance (i.e., before they occur).

Obviously, the apparatus described above can be used for widely differing purposes.

The asynchronous event or the signal which signals the event may, in this case, also be used solely as a clock by which data are output asynchronously from a synchronous system, for example. In this case, it is sufficient for the asynchronous event to be used to actuate the switching device 3 (to actuate control connection C).

It is noted that the above described arrangement is not limited to operating on only one asynchronous input signal. Any desired number of synchronous and/or asynchronous input signals may be taken into account. In this case, it is irrelevant whether the asynchronous input signals are in synchronism with one another.

The above described apparatus is an electrical system. However, the apparatus could also be an electromechanical or mechanical system. The above statements apply as appropriate to such systems. In this case, however, the terms "input and output signals" may mean mechanical states.

The described apparatus makes it possible for responses by synchronous systems to asynchronous events to be output immediately after said events occur.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An apparatus for immediately outputting a response of a synchronous system to an asynchronous event, comprising:
    a synchronous system configured to receive an asynchronous event at its input to produce an output signal with a delay at its output;
    an advanced calculation unit configured to calculate an output signal identical to the output signal that will be output by the synchronous system in response to the asynchronous event provided at an input of the advanced calculation unit, the output signal being calculated in advance of the synchronous system producing the output signal; and
    a switching device that selectively passes on the output signal from the advanced calculation unit or the output signal from the synchronous system.

2. The apparatus as claimed in claim 1, wherein
    the switching device has at least two input connections, one of the at least two input connections is connected to the output connection of the synchronous system, and at least one of the at least two input connections is connected to the output of the advanced calculation unit.

3. The apparatus as claimed in claim 2, wherein the switching device has a control connection, via which the input signals intended to be passed on by the switching device are defined.

4. The apparatus as claimed in claim 1, wherein the apparatus is configured to output the output signal from the advanced calculation unit in response to the occurrence of the asynchronous event.

5. The apparatus as claimed in claim 1, wherein the apparatus is configured to output the output signal from the synchronous system as soon as the output signal from the synchronous system represents a response to the asynchronous event.

6. The apparatus as claimed in claim 1, wherein the synchronous system is configured to output the output signal within a first period of time to provide the advanced calculation unit a sufficient amount of time after the first period of time to calculate an output signal to a next asynchronous event at its input.

7. The apparatus as claimed in claim 1, wherein the advanced calculation unit is configured to complete advanced calculations to a next asynchronous event before the next asynchronous event occurs.

* * * * *